United States Patent
Huang et al.

(10) Patent No.: US 10,062,775 B2
(45) Date of Patent: Aug. 28, 2018

(54) GAN-BASED POWER ELECTRONIC DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Sen Huang, Beijing (CN); Xinyu Liu, Beijing (CN); Xinhua Wang, Beijing (CN); Ke Wei, Beijing (CN); Qilong Bao, Beijing (CN); Wenwu Wang, Beijing (CN); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/368,098

(22) Filed: Dec. 2, 2016

(65) Prior Publication Data

US 2017/0309736 A1 Oct. 26, 2017

(30) Foreign Application Priority Data

Apr. 26, 2016 (CN) .......................... 2016 1 0265883

(51) Int. Cl.
*H01L 21/00* (2006.01)
*H01L 29/00* (2006.01)
(Continued)

(52) U.S. Cl.
CPC .... *H01L 29/7786* (2013.01); *H01L 21/30621* (2013.01); *H01L 29/155* (2013.01);
(Continued)

(58) Field of Classification Search
CPC ........... H01L 21/30621; H01L 21/0254; H01L 21/02389; H01L 29/7786; H01L 29/155;
(Continued)

(56) References Cited

U.S. PATENT DOCUMENTS 7,417,258 B2 * 8/2008 Hooper .................. B82Y 20/00
257/86
8,748,939 B2 * 6/2014 Takizawa .......... H01L 21/02381
257/189
(Continued)

FOREIGN PATENT DOCUMENTS

CN 1855565 4/2006
CN 101752389 6/2010
(Continued)

OTHER PUBLICATIONS

First Chinese Office Action, issued in the corresponding Chinese patent application No. 201610265883.8, dated May 21, 2018, 18 pages (with English translation).

*Primary Examiner* — Nikolay Yushin
(74) *Attorney, Agent, or Firm* — Hamre, Schumann, Mueller & Larson, P.C.

(57) ABSTRACT

A GaN-based power electronic device and a method for manufacturing the same is provided. The GaN-based power electronic device comprising a substrate and an epitaxial layer over the substrate. The epitaxial layer comprises a GaN-based heterostructure layer, a superlattice structure layer and a P-type cap layer. The superlattice structure layer is provided over the heterostructure layer, and the P-type cap layer is provided over the superlattice structure layer. By using this electronic device, gate voltage swing and safe gate voltage range of the GaN-based power electronic device manufactured on the basis of the P-type cap layer technique may be further extended, and dynamic characteristics of the device may be improved. Therefore, application process for (Continued)

the GaN-based power electronic device that is based on the P-type cap layer technique will be promoted.

8 Claims, 4 Drawing Sheets

(51) Int. Cl.
    *H01L 29/778* (2006.01)
    *H01L 29/66* (2006.01)
    *H01L 29/205* (2006.01)
    *H01L 29/20* (2006.01)
    *H01L 29/15* (2006.01)
    *H01L 21/306* (2006.01)

(52) U.S. Cl.
    CPC ........ *H01L 29/2003* (2013.01); *H01L 29/205* (2013.01); *H01L 29/66462* (2013.01)

(58) Field of Classification Search
    CPC ............... H01L 29/2003; H01L 29/205; H01L 29/66462
    See application file for complete search history.

(56) References Cited

U.S. PATENT DOCUMENTS

| | | | |
|---|---|---|---|
| 9,406,836 B2 * | 8/2016 | Grillot | ............... H01L 33/007 |
| 2006/0244002 A1 * | 11/2006 | Hooper | ............... B82Y 20/00 |
| | | | 257/103 |
| 2007/0108077 A1 | 5/2007 | Lung et al. | |
| 2012/0299059 A1 * | 11/2012 | Takizawa | ........... H01L 21/02381 |
| | | | 257/190 |
| 2015/0207024 A1 * | 7/2015 | Grillot | ............... H01L 33/007 |
| | | | 257/13 |

FOREIGN PATENT DOCUMENTS

| | | |
|---|---|---|
| CN | 103972284 | 8/2014 |
| CN | 104051523 | 9/2014 |
| CN | 104716176 | 6/2015 |
| WO | 2011/117936 | 9/2011 |

* cited by examiner

GAN-BASED POWER ELECTRONIC DEVICE AND METHOD FOR MANUFACTURING THE SAME

TECHNICAL FIELD

The present disclosure relates to the field of GaN-based power electronic technology, and particularly to a GaN-based power electronic device and a method for manufacturing the same.

BACKGROUND

High efficient power electronic devices (also referred to as power switch devices) are of significant application value in domains such as smart grids, industrial controlling, new energy power generation, electric vehicles, and consumer electronics, etc. Globally, more than 70% of power electronic systems are manipulated and administrated by power administration systems based on power semiconductor devices. Performance of conventional Si power electronic devices approaches to physical limit of Si semiconductor materials. Novel type of wide forbidden-band semiconductor devices, such as SiC and GaN, have higher breakdown electric field value, higher operation frequency and even lower on-resistance, and thus have already become promising candidates for the next generation of high efficient power electronics.

Enhancement-mode is essential for safe operation of power electronic devices, which ensures safety of the devices even without gate control when it is operated under high voltage, and will not cause damages of the system. For this reason, the power electronic devices have to be enhancement-mode (also referred to as normally-off) devices, that is, thresholds for the devices must be above 0V. Currently, GaN-based enhancement-mode power electronic devices are mainly manufactured on the basis of Al(In,Ga)N/GaN heterostructures, in which, relying on strong spontaneous piezoelectric polarization effect between Al(In,Ga)N barrier layers and GaN buffer layers, a two-dimensional electron gas (2 DEG) with a density of up to $10^{13}$ cm$^{-2}$ will be induced in channels of Al(In,Ga)N/GaN heterostructures. Therefore, GaN-based power electronic devices which are manufactured based on such structures (including HEMTs and MIS-HEMTs) are generally depletion-type. Several kinds of techniques are world-widely used to realize GaN-based enhancement-mode devices, mainly comprising: 1) thinning the Al(In,Ga)N barrier layer by gate trench etching; 2) injecting negative fluoride ions into the Al(In,Ga)N barrier layer; 3) growing a P—(Al)GaN cap layer on surface of the barrier layer; 4) growing a InGaN or thick GaN anti-polarization layer on surface of the barrier layer; 5) a cascode configuration of enhancement-mode Si-MOSFET and GaN-based depleted HEMT/MIS-HEMT.

The P—(Al)GaN cap layer technique depletes the 2 DEG in a channel of the Al(In,Ga)N/GaN heterostructure by utilizing the space-charge region effect of a PN-junction, so as to implement the enhancement-mode. It continues to in-situ epitaxial grow a P—(Al)GaN cap layer on the Al(In,Ga)N/GaN heterostructures by means of Metal Organic Chemical Vapor Deposition (MOCVD) or molecular beam epitaxy (MBE). The epitaxial technique can provide accurate control on thickness and uniformity, therefore, a fine threshold consistency may be generally obtained when the P—(Al)GaN technique is adopted. Specifically, exemplary products for P—(Al)GaN technique have been reported by manufactures such as Efficient Power Conversion Corporation (EPC) in US, Panasonic in Japan, Samsung in Korea, GaN Systems in Canada, and TSMC in Taiwan.

Although the P—(Al)GaN cap layer technique has raised the threshold for GaN-based enhancement-mode device to +1.5 V, when gate voltage is above forward turn-on voltage for the PN junction, forward leakage for the gate will increases very quickly, and will possibly lead to breakdown of the gate, and thus affect safety of the device. Therefore, in order to promote application and industrialization of the P—(Al)GaN cap layer technique in the GaN-based Power electronics, it is essential to develop a gate leakage inhibition technique on the basis of the P—(Al)GaN cap layer.

In addition, because of the presence of the surface state, GaN-based power electronic device may exhibit serious current collapse phenomenon when it is operated at high voltage, which directly leads to increase of dynamic on-resistance and power consumption of the device. Researches have shown that such a surface state can hardly be completely avoided. Therefore, it will be more applicable to develop a technique for facilitating fast recovery of the surface state and thus avoid the hard nut of dealing with the surface state.

However, the above electronic device cannot meet requirements for electronic devices due to its low gate leakage performance, and it also needs to catch up with the strict standard on the aspect of threshold control ability including self-repairing of current collapse.

SUMMARY

Problem to be Solved

The object of the present disclosure is to provide a GaN-based power electronic device and a method for manufacturing the same, so as to solve at least one of the above issues.

Technical Solutions

In order to achieve the above object, a GaN-based power electronic device is provided according to an aspect of the present disclosure. The GaN-based power electronic device comprises a substrate and an epitaxial layer over the substrate, wherein the epitaxial layer comprises a GaN-based heterostructure layer, a superlattice structure layer and a P-type cap layer, the superlattice structure layer is provided over the heterostructure layer, and the P-type cap layer is provided over the superlattice structure layer.

In a preferred embodiment, the superlattice structure layer is a AlN/GaN superlattice structure, a Al(In,Ga)N/InGaN superlattice structure, a AlN/GaN/AlN quantum well structure or a Al(In,Ga)N/InGaN/Al(In,Ga)N quantum well structure.

In a preferred embodiment, Al(In,Ga)N thickness and InGaN thickness in a single period of the Al(In,Ga)N/InGaN superlattice are respectively x nm and y nm, where 1≤x≤4, 1≤y≤4.

In a preferred embodiment, the superlattice structure layer is a P-type doped layer or a non-doped layer.

In a preferred embodiment, the heterostructure layer comprises a buffer layer and a barrier layer over the buffer layer, and the buffer layer is a GaN buffer layer, the barrier layer is a Al(In, Ga)N barrier layer.

In a preferred embodiment, the P-type cap layer is a binary alloy layer of P—GaN, P—InN or P—AlN, or a ternary alloy layer of P—AlGaN. P—AlInN or P—InGaN, or a quaternary alloy layer of AlInGaN.

According to another aspect of the present disclosure, a method for manufacturing a GaN-based power electronic device is provided. The method comprises steps of: (1) preparing a substrate; (2) forming, over the substrate, a epitaxial layer comprising a GaN-based heterostructure layer, a superlattice structure layer and a P-type cap layer, the superlattice structure layer is provided over the heterostructure layer, and the P-type cap layer is provided over the superlattice structure layer; and (3) forming a gate, a source, a drain and a passivation layer over the epitaxial layer.

In a preferred embodiment, the superlattice structure layer is provided between the gate and the source and between the gate and the drain, or the superlattice structure layer is not provided between the gate and the source and between the gate and the drain.

In a preferred embodiment, the P-type cap layer is removed between the gate and the source and between the gate and the drain by using a dry etching approach with the superlattice structure layer as a stopping layer.

In a preferred embodiment, the gate of the device is a Schottky contact or an Ohm contact.

Beneficial Effects

From the above technical solutions, it can be seen that the present disclosure possesses the following effects:

1. By the GaN-based power electronic device structure and method for manufacturing the same as provided in the present disclosure, a technique for inhibiting forward and reverse leakage of the gate in the GaN-based enhancement-mode power electronic device that is based on a P-type Al(In,Ga)N cap layer technique from perspectives of material growing and band engineering. A layer of Al(In,Ga)N/InGaN superlattice is inserted between the P-type cap layer and the heterostructure to increase barrier height of the gate, and hence inhibits forward and reverse leakage and further extends gate voltage swing and safe gate voltage range of the GaN-based power electronic device manufactured on the basis of the P-type cap layer technique. This will promote application process for the GaN-based power electronic device that is based on the P-type cap layer technique, and facilitate industrialization of the GaN-based power electronic device.

2. In the GaN-based power electronic device structure and method for manufacturing the same as provided in the present disclosure, when the gate is forward turned on, recombination luminescence of electrons and holes in the superlattice located between the P-type cap layer and the heterostructure can promote release of trapped electrons inside and on the surface of the heterostructure between the gate and the drain and between the gate and the source, so as to achieve synchronous self-recovery of current collapse in the device and thus effectively inhibit increase of dynamic on-resistance in the device.

3. In the GaN-based power electronic device structure and method for manufacturing the same as provided in the present disclosure, the superlattice structure between the P-type cap layer and the heterostructure may be used as a stopping layer when dry etching the P-type cap layer, so as to improve uniformity of the on-resistance in the device and production yield of the devices.

DETAILED DESCRIPTION

Figure 1A:
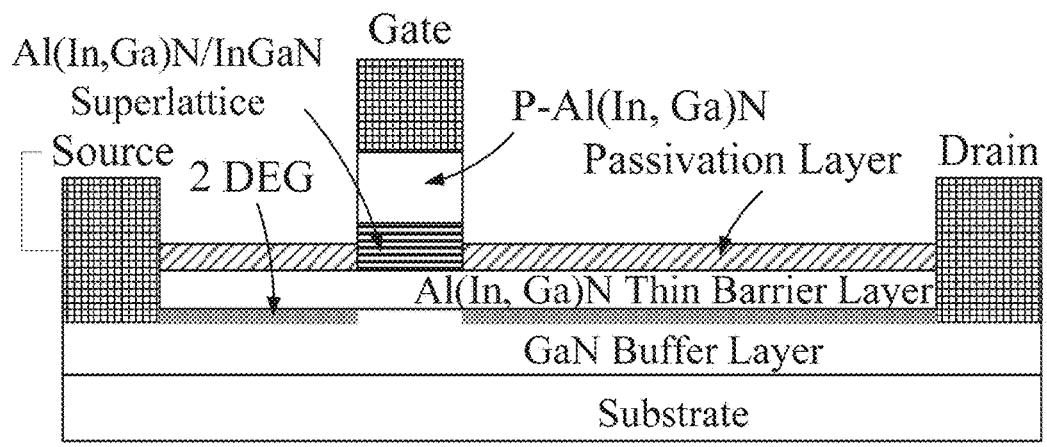
FIG. 1a and FIG. 1b are schematic diagrams of two GaN-based power electronic device structures according to embodiments of the present disclosure.

In the present disclosure, expressions like "below" and "under" only indicate relative positional relationship of corresponding layer structures. The corresponding layers may contact with each other or not. In addition, in the following description, details are descried to provide thorough understanding of the embodiments of the present disclosure, in order to facilitate interpretation of the technical solutions. Obviously, one or more embodiments may be implemented without these details. In other cases, well known structures and apparatuses may be embodied by the drawings so as to simplify the drawings.

According to a general concept of the present disclosure, a GaN-based power electronic device is provided. The GaN-based power electronic device comprises a substrate and an epitaxial layer over the substrate, wherein the epitaxial layer comprises a GaN-based heterostructure layer, a superlattice structure layer and a P-type cap layer, the superlattice structure layer is provided over the heterostructure layer, and the P-type cap layer is provided over the superlattice structure layer.

Regarding the substrate, it may be a silicon substrate, a SiC substrate, a sapphire substrate, or a homo-epitaxial GaN substrate.

Regarding the method for manufacturing respective epitaxial layers, Metal Organic Chemical Vapor Deposition (MOCVD) or molecular beam epitaxy (MBE) may be used. For those epitaxial layer structures with a GaN-based heterostructure layer, a superlattice structure layer and a P-type cap layer, they have enhancement-mode gate structures.

Regarding the superlattice structure layer, preferably, the superlattice structure layer is a multi-period Al(In, Ga)N/InGaN superlattice structure. More preferably, the multi-period Al(In, Ga)N/InGaN superlattice structure is a AlN/GaN superlattice structure, a Al(In, Ga)N/InGaN superlattice structure, a AlN/GaN/AlN quantum well structure or a Al(In, Ga)N/InGaN/Al(In, Ga)N quantum well structure. As to thickness for a periodical layer in the superlattice, preferably, Al(In, Ga)N thickness and InGaN thickness in a single period of the Al(In, Ga)N/InGaN superlattice are respectively x nm and y nm, where $1 \leq x \leq 4$, $1 \leq y \leq 4$. The suprelattice that located between the P-type cap layer and the GaN-based heterostructure not only can inhibit forward and reverse leakage of the gate of the GaN-based electronic device, but also promotes release of deep-band captured electrons inside and on the surface of the heterostructure between gate and drain and between gate and source as a result of recombination luminescence of electrons and holes in the superlattice when the gate is forward turned on, so as to achieve synchronous self-recovery of current collapse in the device.

Regarding composition of the superlattice layer, the superlattice structure layer may be a P-type doped layer or a non-doped layer.

Regarding the heterostructure layer, the heterostructure layer comprises a buffer layer and a barrier layer over the buffer layer, and the buffer layer is a GaN buffer layer, the barrier layer is a Al(In, Ga)N barrier layer.

The barrier layer has a thickness in the range of 3-30 nm. Preferably, the above Al(In, Ga)N barrier layer may be a ternary alloy barrier layer of AlGaN or AlInN, or a quaternary alloy barrier layer of AlInGaN.

Regarding the P-type cap layer, preferably, it may be a P—Al(In, Ga)N layer. More preferably, the P-type cap layer is a binary alloy layer of P—GaN, P—InN or P—AlN, or a ternary alloy layer of P—AlGaN, P—AlInN or P—InGaN, or a quaternary alloy layer of AlInGaN.

Preferably, gate metal may be provided over the P-type cap layer. The gate metal may be a Schottky contact or an Ohm contact.

Preferably, the electronic device may further comprise a drain and a source, both of which may be formed by etching off the P-type cap layer or the superlattice layer, and are in Ohm-contact with corresponding layers.

In some solutions, the electronic devices are preferably field effect transistors. In these devices, the P-type cap layers are etched off between the gate and the source and between the gate and the drain. As to the superlattice structure layer, it may be etched off between the gate and the source and between the gate and the drain, or remains un-etched.

Based on the same conception, a method for manufacturing a GaN-based power electronic device is provided. The method comprises steps of: (1) preparing a substrate; (2) forming, over the substrate, a epitaxial layer comprising a GaN-based heterostructure layer, a superlattice structure layer and a P-type cap layer, the superlattice structure layer is provided over the heterostructure layer, and the P-type cap layer is provided over the superlattice structure layer.

Regarding forming respective epitaxial layers, Metal Organic Chemical Vapor Deposition (MOCVD) or molecular beam epitaxy (MBE) may be used.

The P-type cap layer is removed between the gate and the source and between the gate and the drain by using a dry etching approach with the superlattice structure layer as a stopping layer.

Preferably, after step (2), a gate, a source, a drain and a passivation protection layer may be manufactured over the epitaxial layer by using a gate-first process or gate-last process.

In the gate-first process, the gate is first manufactured on the epitaxial layer, the P-type cap layer is etched off except for the portion corresponding to the gate to form source and drain Ohm contacts, and lastly, the passivation protection layer may be formed over the gate, the source and access regions between the gate and the source and between the gate and the drain, respectively.

In the gate-last process, on the basis of the epitaxial layer, the P-type cap layer is etched off in regions corresponding to the source and the drain to form a source-drain Ohm contact, then the gate is formed over the P-type cap layer, and lastly, the passivation protection layer may be formed by etching off the P-type cap layer between the gate and the source and between the gate and the drain, respectively.

In the following, the technical solution will be described in detail by means of embodiments with reference to the drawings. The following description is to interpret the general conception of the present disclosure, and should not be deemed as limitations on the scope of the present disclosure.

Figure 1B:
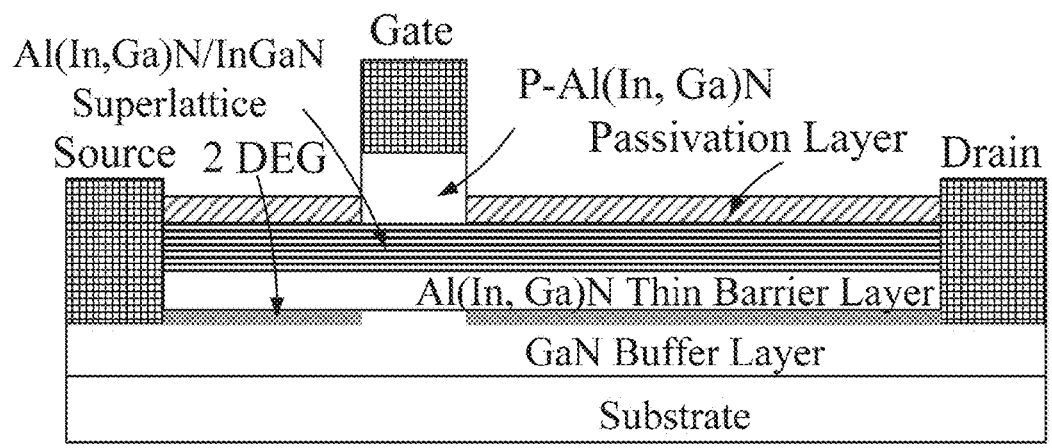

The two kinds of GaN-based power electronic devices provided by the present disclosure are shown in FIGS. 1a and 1b. Each device comprises: a substrate; a GaN-based high mobility Al(In,Ga)N/GaN heterostructure formed over the substrate; a multi-period Al(In, Ga)N/InGaN superlattice structure formed over the GaN-based high mobility Al(In, Ga)N/GaN heterostructure; and a P-type Al(In,Ga)N layer formed over the superlattice structure. The electronic device is a field effect transistor, which comprises a source, a gate, and a drain. The gate is formed over the P—Al(In,Ga)N and in the form of an Ohm contact or a Schottky contact. The source and the drain are formed by etching off the P—Al(In,Ga)N layer or a P—Al(In,Ga)N/(Al(In, Ga)N/InGaN)$_{SL}$ layer, and they are Ohm contacts. In addition, the P—Al(In, Ga)N layer is etched off between the gate and the source and between the gate and the drain. However, the Al(In, Ga)N/InGaN superlattice structure layer between the gate and the source and between the gate and the drain may be also etched off (FIG. 1a), or remains un-etched (FIG. 1b).

In FIGS. 1a and 1b, the P—Al(In,Ga)N/(Al(In, Ga)N/InGaN)$_{SL}$/Al(In,Ga)N/GaN epitaxial layer structure is formed by successively epitaxial grow a GaN buffer layer, a Al(In, Ga)N barrier layer, a (Al(In, Ga)N/InGaN)$_{SL}$ superlattice, a P-type Al(In,Ga)N layer directly over the substrate by using Metal Organic Chemical Vapor Deposition (MOCVD) or molecular beam epitaxy (MBE), so as to achieve an enhancement-mode gate structure. The Al(In, Ga)N barrier layer may be a ternary alloy barrier layer of AlGaN or AlInN, or a quaternary alloy barrier layer of AlInGaN. The (Al(In, Ga)N/InGaN)$_{SL}$ superlattice layer is a AlN/GaN superlattice structure, a Al(In, Ga)N/InGaN superlattice structure, a AlN/GaN/AlN quantum well structure or a Al(In, Ga)N/GaN/Al(In, Ga)N quantum well structure. The (Al(In, Ga)N/InGaN)$_{SL}$ superlattice layer may be a Al(In, Ga)N/InGaN (2 nm/2 nm) superlattice, or a Al(In, Ga)N/InGaN(x nm/y nm) superlattice. The (Al(In, Ga)N/InGaN)$_{SL}$ superlattice layer may be a P-type doped layer or a non-doped layer. The P—Al(In,Ga)N layer is a binary alloy layer of P—GaN, P—InN or P—AlN, or a ternary alloy layer of P—AlGaN, P—AlInN or P—InGaN, or a quaternary alloy layer of AlInGaN. The substrate may be a silicon substrate, a SiC substrate, a sapphire substrate, or a homo-epitaxial GaN substrate.

Figure 2A:
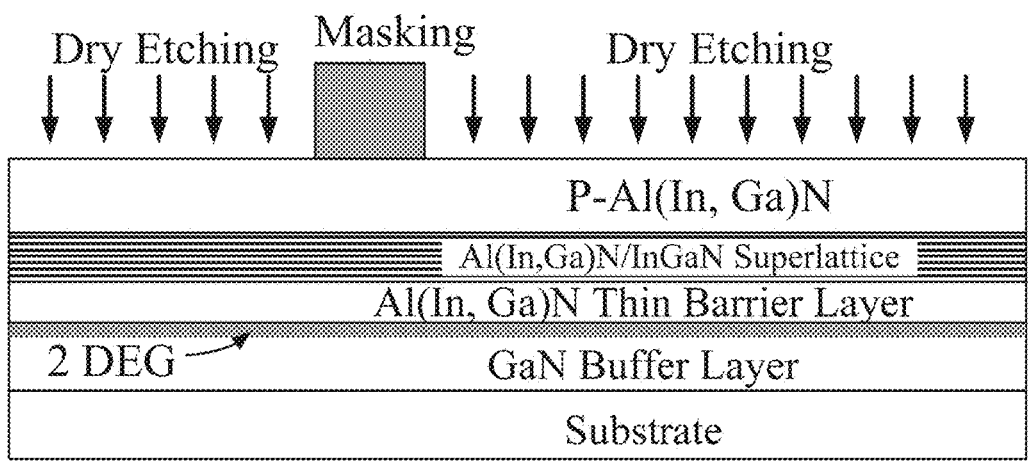
FIG. 2a and FIG. 2b are schematic diagrams for dry etching a P-type Al(In,Ga)N layer in a region excluding the gate as shown in FIG. 1.
Figure 2B:
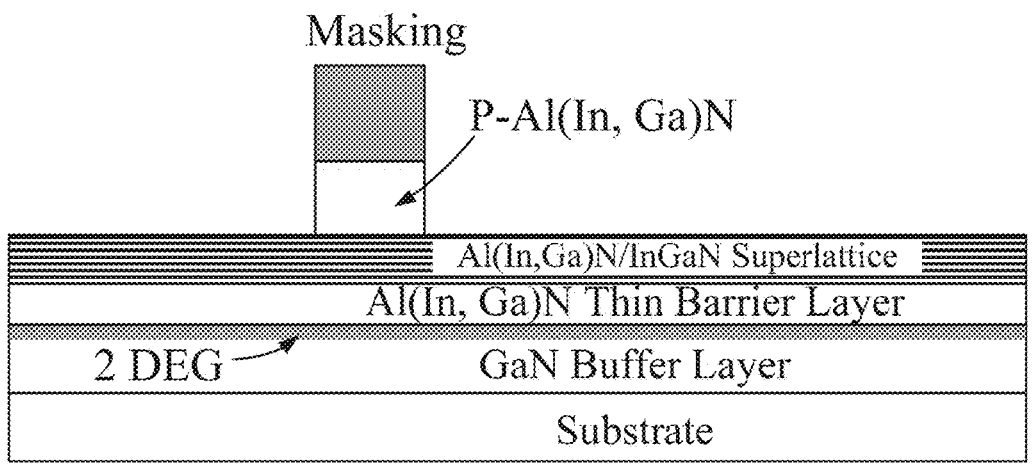

FIG. 2a and FIG. 2b are schematic diagrams for dry etching a P-type Al(In,Ga)N layer in a region excluding the gate as shown in FIG. 1. By shielding with a gate mask, the P-type Al(In,Ga)N layer in the region excluding the gate may be dry etched with Cl-based plasma (Cl$_2$, BCl$_3$) (FIG. 2a), until reaching the Al(In, Ga)N/InGaN superlattice stopping layer (FIG. 2b).

Figure 3:
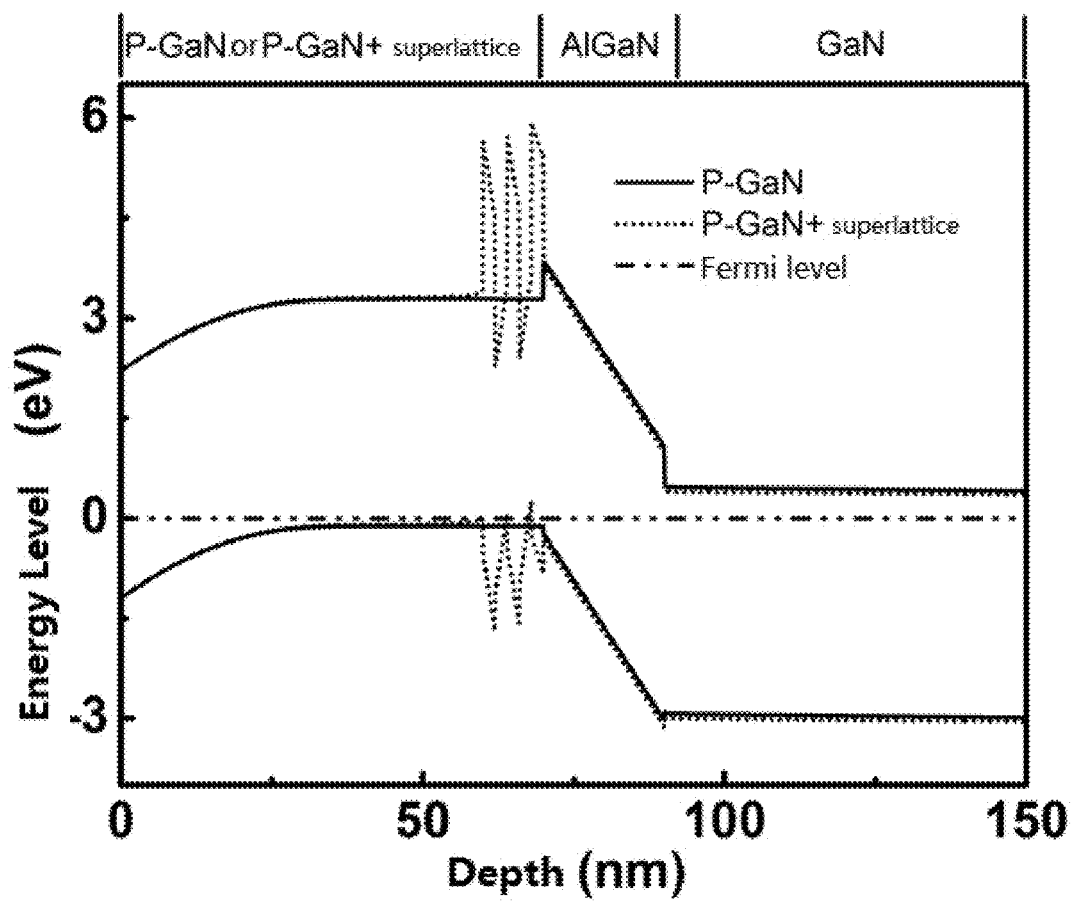
FIG. 3 shows comparison of band diagrams for situations before and after the Al(In, Ga)N/InGaN superlattice layer is inserted between the P-type Al(In,Ga)N layer and the Al(In, Ga)N/GaN heterostructure.

FIG. 3 shows comparison of energy band diagrams for situations before and after the Al(In, Ga)N/InGaN superlattice layer is inserted between the P-type Al(In,Ga)N layer and the Al(In,Ga)N/GaN heterostructure. It can be seen that, because of the presence of the Al(In, Ga)N/InGaN superlattice, height of the barrier between the P-type Al(In,Ga)N layer and the Al(In,Ga)N/GaN heterostructure is significantly increased, so as to effectively inhibit forward and reverse leakage of the gate.

Figure 4A:
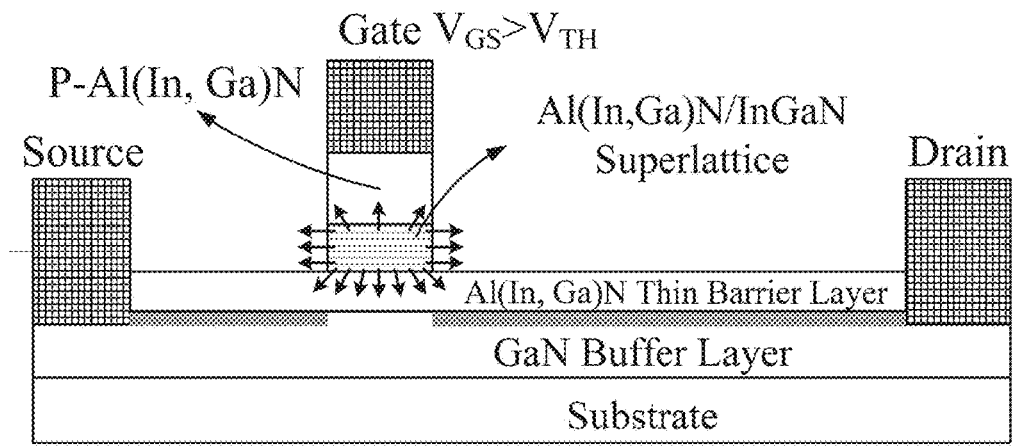
FIG. 4a and FIG. 4b are schematic diagrams of illumination and propagation in the below-gate Al(In, Ga)N/InGaN superlattice inserting layer when the gate is forward turned on, with respect to the two kinds of GaN-based power electronic devices as shown in FIGS. 1a and 1b.
Figure 4B:
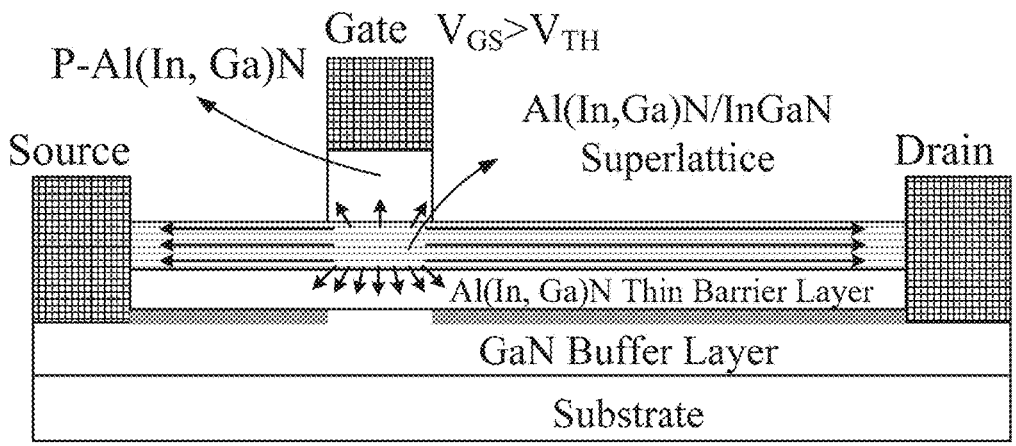

The present disclosure provides two kinds of GaN-based enhancement-mode power electronic devices with self-recovery ability and low gate leakage. The Al(In, Ga)N/InGaN superlattice that located between the P-type Al(In,Ga)N layer and the GaN-based high mobility Al(In,Ga)N/GaN heterostructure not only can inhibit forward and reverse leakage of the gate of the GaN-based enhancement-mode electronic device, but also enables recombination luminescence of electrons and holes in the Al(In, Ga)N/InGaN superlattice when the gate is forward turned on, as shown in FIGS. 4a and 4b. the luminescence promotes release of trapped electrons inside and on the surface of the Al(In,Ga)N/GaN heterostructure between the gate and the drain and between the gate and the source, so as to achieve synchronous self-recovery of current collapse in the device.

Although the above embodiments further illustrate targets, technical solutions, and beneficial effects of the present disclosure, it will be understood that, such embodiments are only exemplary rather than limitative. Those skilled in the art may carry out various replacements and modifications without departing the scope of the present disclosure. Such replacements and modifications are within the scope of the present disclosure.

We claim:

1. A GaN-based power electronic device comprising a substrate and an epitaxial layer disposed on the substrate, wherein:
   the epitaxial layer comprises a GaN-based heterostructure layer, a superlattice structure layer and a P-type cap layer,
   a gate, a source, a drain and a passivation layer are disposed on the epitaxial layer;
   the superlattice structure layer is inserted between the GaN-based heterostructure layer and the P-type cap layer so as to enhance the barrier height of the gate of the GaN-based power electronic device and to suppress the current collapse induced by traps inside and on the surface of the heterostructure,
   wherein Al(In, Ga)N thickness and InGaN thickness in a single period of the Al(In, Ga)N/InGaN superlattice structure are respectively in a range of 1-4 nm, and
   the P-type cap layer between the gate and the source and between the gate and the drain is removed by using the superlattice structure layer as a stopping layer.

2. The GaN-based power electronic device according to claim 1, wherein the superlattice structure layer is a AlN/GaN superlattice structure, a Al(In,Ga)N/InGaN superlattice structure, a AlN/GaN/AlN quantum well structure or a Al(In,Ga)N/InGaN/Al(In, Ga)N quantum well structure.

3. The GaN-based power electronic device according to claim 2, wherein the superlattice structure layer is a P-type doped layer or a non-doped layer.

4. The GaN-based power electronic device according to claim 1, wherein the heterostructure layer comprises a buffer layer and a barrier layer disposed on the buffer layer, and the buffer layer is a GaN buffer layer, the barrier layer is a Al(In,Ga)N barrier layer.

5. The GaN-based power electronic device according to claim 1, wherein the P-type cap layer is a binary alloy layer of P—GaN, P—InN or P—AlN, or a ternary alloy layer of P—AlGaN, P—AlInN or P—InGaN, or a quaternary alloy layer of P—AlInGaN.

6. A method for manufacturing a GaN-based power electronic device comprising steps of:
   (1) preparing a substrate;
   (2) forming, on the substrate, a epitaxial layer comprising a GaN-based heterostructure layer, a superlattice structure layer and a P-type cap layer, the superlattice structure layer is disposed on the heterostructure layer, and the P-type cap layer is disposed on the superlattice structure layer, and
   (3) forming a gate, a source, a drain and a passivation layer on the epitaxial layer,
   wherein the P-type cap layer between the gate and the source and between the gate and the drain is removed by using a dry etching approach with the superlattice structure layer as a stopping layer.

7. The method according to claim 6, wherein the superlattice structure layer is provided between the gate and the source and between the gate and the drain, or the superlattice structure layer is not provided between the gate and the source and between the gate and the drain.

8. The method according to claim 6, wherein the gate of the device is a Schottky contact or an Ohmic contact.

* * * * *